(12) United States Patent
Boeve

(10) Patent No.: US 7,382,642 B2
(45) Date of Patent: Jun. 3, 2008

(54) METHOD AND DEVICE FOR PREVENTING ERRONEOUS PROGRAMMING OF A MAGNETORESISTIVE MEMORY ELEMENT

(75) Inventor: Hans Marc Bert Boeve, Eindhoven (NL)

(73) Assignee: NXP B.V., Eindhoven (NL)

( * ) Notice: Subject to any disclaimer, the term of this patent is extended or adjusted under 35 U.S.C. 154(b) by 96 days.

(21) Appl. No.: 10/579,935

(22) PCT Filed: Nov. 9, 2004

(86) PCT No.: PCT/IB2004/052357

§ 371 (c)(1),
(2), (4) Date: May 19, 2006

(87) PCT Pub. No.: WO2005/050658

PCT Pub. Date: Jun. 2, 2005

(65) Prior Publication Data

US 2007/0153572 A1    Jul. 5, 2007

(30) Foreign Application Priority Data

Nov. 24, 2003  (EP) ................... 03104339

(51) Int. Cl.
*G11C 11/00* (2006.01)
(52) U.S. Cl. ...................................... 365/158; 365/213
(58) Field of Classification Search ................ 365/158, 365/171, 173, 211, 213 X, 213
See application file for complete search history.

(56) References Cited

U.S. PATENT DOCUMENTS

| | | | | |
|---|---|---|---|---|
| 6,760,201 | B2 * | 7/2004 | Nakashio et al. | 360/324.2 |
| 6,958,929 | B2 * | 10/2005 | Abraham et al. | 365/158 |
| 6,999,339 | B2 * | 2/2006 | Tuttle et al. | 365/158 |
| 7,227,774 | B2 * | 6/2007 | Tuttle et al. | 365/158 |

* cited by examiner

*Primary Examiner*—VanThu Nguyen
(74) *Attorney, Agent, or Firm*—Peter Zawilski

(57) ABSTRACT

An array of magnetoresistive memory elements includes a magnetic field sensor for measuring an external magnetic field in the vicinity of the magnetoresistive memory elements. The sensor provides input to enable/disable circuitry that functions to temporarily disable any programming operation when the measured external magnetic field exceeds a threshold value.

11 Claims, 2 Drawing Sheets

Figure 3:
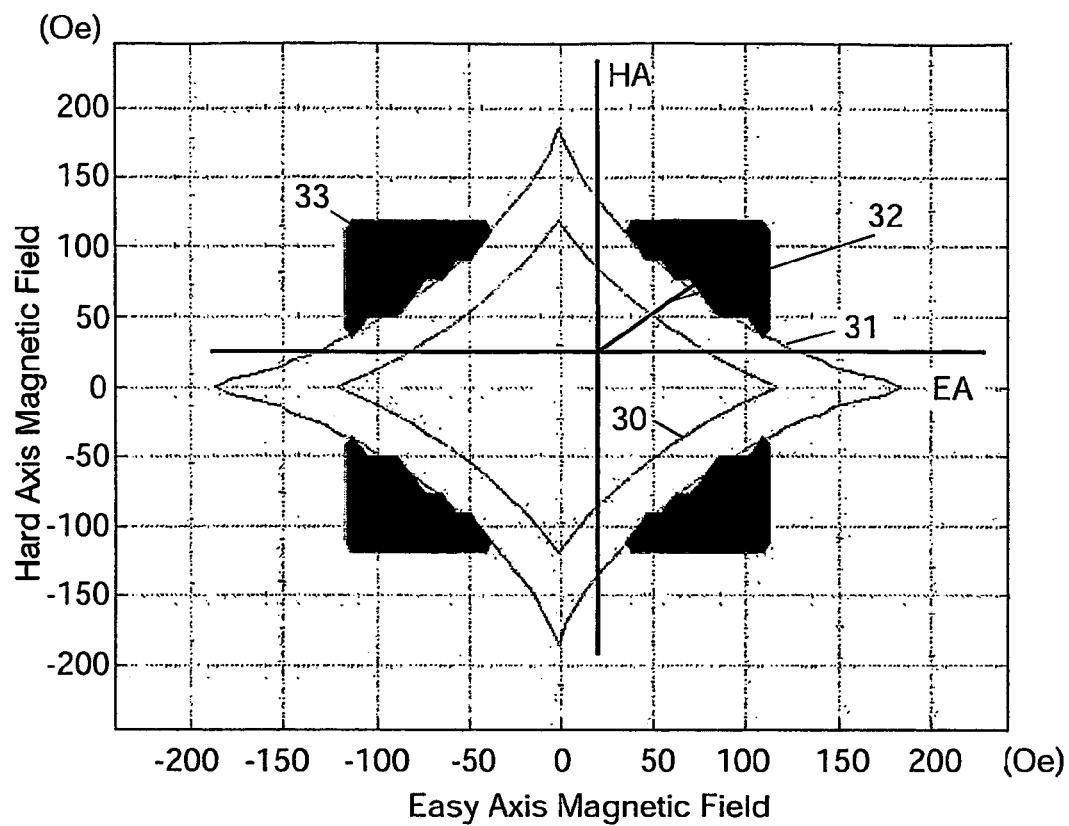

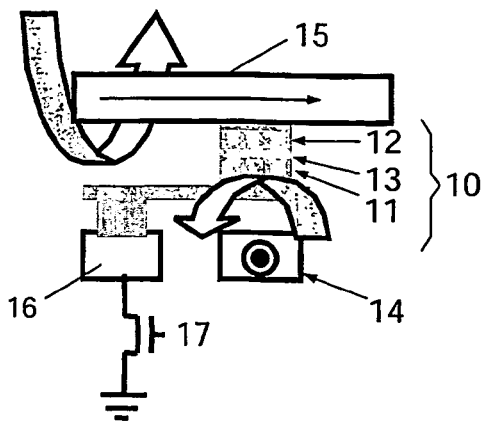
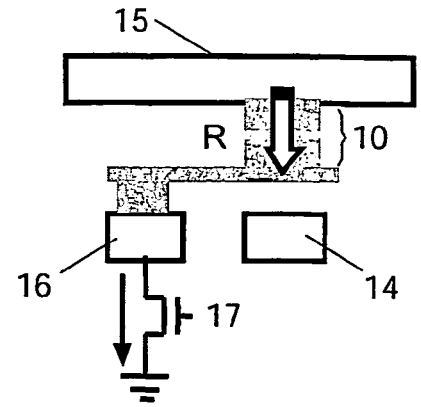
FIG.1A  FIG.1B
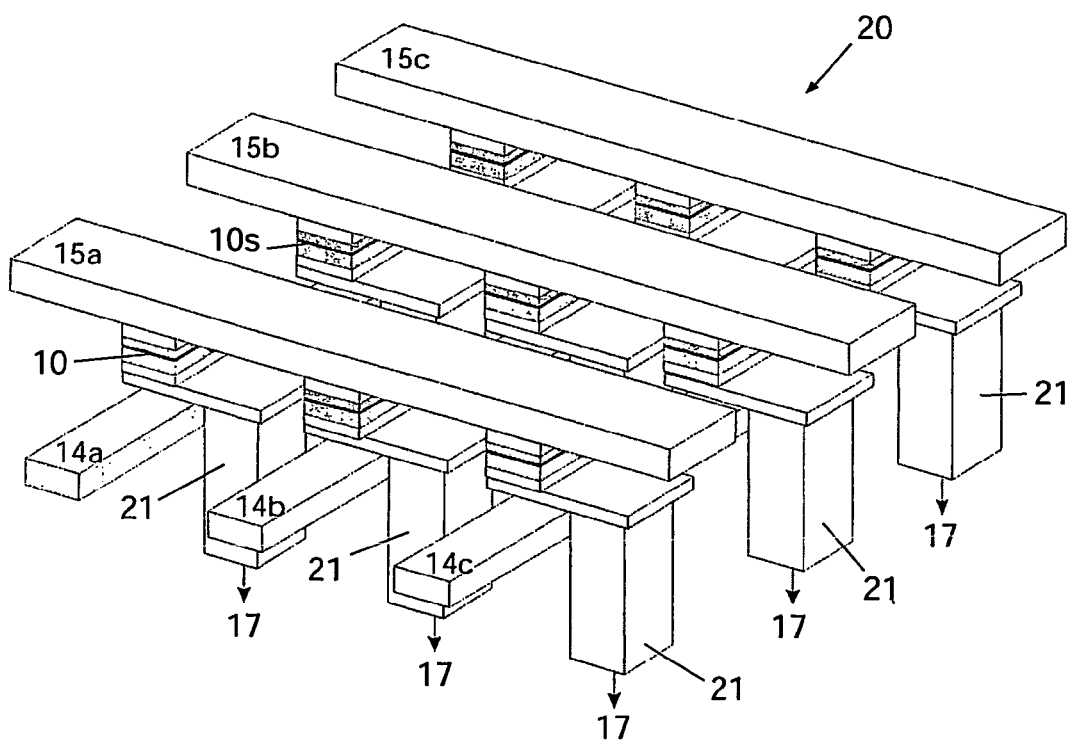
FIG.2

METHOD AND DEVICE FOR PREVENTING ERRONEOUS PROGRAMMING OF A MAGNETORESISTIVE MEMORY ELEMENT

The present invention relates to a method and device for preventing erroneous programming of a magnetoresistive memory element, such as an MRAM device, during presence of an external magnetic field.

Magnetic or Magnetoresistive Random Access Memory (MRAM) is currently being considered by many companies as a successor to flash memory. It has the potential to replace all but the fastest static RAM (SRAM) memories. This makes MRAM very suitable as embedded memory for System on Chip (SoC). It is a non-volatile memory (NVM) device, which means that no power is required to sustain the stored information. This is seen as an advantage over most other types of memory. MRAM memories can be used in particular for 'mobile' applications, such as smartcards, mobile phones, PDA's, etc.

The MRAM concept was originally developed at Honeywell Corp. USA, and uses magnetization direction in a magnetic multi-layer device as information storage and the resultant resistance difference for information readout. As with all memory devices, each memory element in an MRAM array must be able to store at least two binary states which represent either a "1" or a "0".

Different kinds of magnetoresistive (MR) effects exist, of which the Giant Magneto-Resistance (GMR) and Tunnel Magneto-Resistance (TMR) are currently the most important ones. The GMR effect and the TMR effect provide possibilities to realize a.o. non-volatile magnetic memories. These devices comprise a stack of thin films of which at least two are ferromagnetic or ferrimagnetic, and which are separated by a non-magnetic interlayer. GMR is the magneto-resistance for structures with conductor inter-layers and TMR is the magneto-resistance for structures with dielectric inter-layers. If a very thin conductor is placed between two ferromagnetic or ferrimagnetic films, then the effective in-plane resistance of the composite multi-layer structure is smallest when the magnetization directions of the films are parallel and largest when the magnetization directions of the films are anti-parallel. If a thin dielectric interlayer is placed between two ferromagnetic or ferrimagnetic films, tunneling current between the films is observed to be the largest (or thus resistance to be the smallest) when the magnetization directions of the films are parallel and tunneling current between the films is the smallest (or thus resistance the largest) when the magnetization directions of the films are anti-parallel.

Magneto-resistance is usually measured as the percentage increase in resistance of the above structures going from parallel to anti-parallel magnetization states. TMR devices provide higher percentage magneto-resistance than GMR structures, and thus have the potential for higher signals and higher speed. Recent results indicate tunneling giving over 40% magneto-resistance, compared to 10-14% magneto-resistance in good GMR memory elements.

A typical MRAM device comprises a plurality of magnetoresistive memory elements 10 of which one is illustrated in FIGS. 1A and 1B, e.g. magnetic tunneling junction (MTJ) elements, arranged in an array. An array 20 of magnetoresistive memory elements 10 is illustrated in FIG. 2. MTJ memory elements 10 generally include a layered structure comprising a fixed or pinned hard magnetic layer 11, a free layer 12 and a dielectric barrier 13 in between. The pinned layer 11 of magnetic material has a magnetic vector that always points in the same direction. The free layer 12 is used for information storage. The magnetic vector of the free layer 12 is free, but constrained within the easy axis EA of the free layer 12, which is determined chiefly by the physical dimensions of the memory element 10. The magnetic vector of the free layer 12 points in either of two directions: parallel or anti-parallel with the magnetization direction of the pinned layer 11, which coincides with the said easy axis. The fundamental principle of MRAM is the storage of information as binary data, e.g. as "0" and "1", based on directions of magnetization. This is why the magnetic data is non-volatile and will not change until it is affected by a magnetic field.

Storing or writing data into a magnetoresistive memory element 10 is accomplished by applying magnetic fields and thereby causing magnetic material in the free layer 12 to be magnetized into either of two possible memory states. When both magnetic films 11, 12 of the layered structure of an MRAM-element 10 are magnetized with the same orientation (parallel), the data is either of two binary values, e.g. "0", otherwise, if both magnetic films 11, 12 of the layered structure of the MRAM-element 10 are magnetized with inverse orientation (anti-parallel), the data is the other binary value, e.g. "1". The magnetic fields are created by passing currents through current lines (word lines 14, 14a, 14b, 14c and bit lines 15, 15a, 15b, 15c) external to the magnetic structures. It is to be noted that two magnetic field components are used to differentiate between a selected memory element 10s and other non-selected memory elements 10.

Reading data is accomplished by sensing resistance changes in a magnetic memory element 10 when magnetic fields are applied. Making use of the fact that the resistance of the layered structure 11, 12, 13 varies depending on whether or not the orientations are parallel, the system can discriminate both binary values of the data, e.g. "0" or "1". The magnetic fields required for readout are created by passing currents through current lines (word lines) external to the magnetic structures, or through the magnetic structures themselves (via bit line 15 and sense lines 16). Reading of a selected memory element 10s is done through a series transistor 17 connected to a via 21 to avoid sneak currents through other memory elements 10.

The most common MRAM design is the type 1T1MTJ (1 transistor 17 per 1 MFJ memory element 10), as illustrated in FIGS. 1A and 1B. A memory array 20 comprising a plurality of memory elements 10 comprises orthogonal bit lines 15a, 15b, 15c and word lines 14a, 14b, 14c patterned separately into two metal layers respectively under and above the magnetic tunnel junction (MTJ) memory elements 10. The bit lines 15a, 15b, 15c are parallel with the hard axis of the memory elements 10, which creates a magnetic field in the easy axis, while the word lines 14a, 14b, 14c otherwise create a magnetic field in the hard axis. In some designs the relations can be reversed, i.e. the bit lines 15 may create a hard axis field and the word lines 14 may create an easy axis field. Writing on a selected memory element 10s is done by simultaneously applying current pulses through the respective bit line 15b and word line 14a that intersect at the selected memory element 10s. The direction of the resultant field makes an angle of 45° with respect to the easy axis of the free layer 12 of the memory element 10s. At this angle, the switching field of the free layer 12 is the smallest, thus writing can be done with the least current.

The switching curve of an MRAM element 10 can be represented by its so-called astroid curve 30, 31 as shown in FIG. 3. The astroid curves 30, 31 unambiguously separate switching and non-switching events for different time periods. In MRAM arrays, statistical variations between memory elements, e.g. variations in size, will lead to statistical variations in the magnetic switching field, hence in the exact size of the astroids. Astroid curve 30 is a curve illustrating 10 year stability for non-selected memory elements 10, and astroid curve 31 is a curve illustrating the required magnetic field for a 10 ns pulse write operation for a selected memory element 10s. In other words, if a magnetic field is being applied within the astroid curve 30, 31, elements will not switch and maintain in their state for 10 years, respectively 10 ns, whereas fields exceeding these astroids may switch the element during the corresponding time frames, if the previous state were the opposite one. Therefore, only if two magnetic field components are present, the bit state of a selected memory element 10s can be switched without altering non-selected memory elements 10.

If the magnitudes of the magnetic fields generated by either current line 14, 15 are the same, the direction of the resultant magnetic field makes an angle of 45° with respect to the easy axis EA of the free layer 12 of the selected memory element 10s. At this angle, the switching field of the free layer 12 is the smallest, as shown by the astroid curve 30, 31 in FIG. 3, thus writing can be done with the least current.

On the one hand, the currents in the selected bit line 15b and word line 14a must be chosen in such a way that the total magnetic field sufficiently exceeds the switching field of the selected memory element 10s at 45° with the easy axis EA, or in other words, so that the end of the resultant field vector 32 is on or outside the astroid curve 31 in this direction (see FIG. 3). On the other hand, the magnitude of the field created by the selected bit line 15b must be significantly smaller than the switching fields in the easy axis direction EA of any of the memory elements 10 lying on the same bit line 15b to prevent undesired over-writing. Also, the magnitude of the field created by the selected word line 14a must be significantly smaller than the switching fields in the hard axis direction HA of any of the memory elements 10 lying on the same word line 14a to prevent undesired over-writing. In other words, for stability of other elements on one of the selected lines, both components must be lying within the astroid 30.

FIG. 3 also illustrates stable on-chip write field windows 33, not taking into account statistical variations between memory elements, i.e. if a resultant magnetic field vector, obtained by applying a first current through a selected bit line and a second current through a selected word line, falls within such on-chip write field window 33, it will switch, the magnetic state of the selected memory element 10s if the previous state were the opposite one, but non-selected memory elements 10 located along one of the selected word or bit lines will not switch states.

It is a disadvantage of MRAM elements that an intentional or unintentional exposure to strong magnetic fields makes them vulnerable. Very high density MRAM arrays 20 are particularly sensitive to magnetic fields mainly because the minuscule MRAM elements 10 require relatively low magnetic fields for read/program operations which depend upon the switching or sensing of magnetic vectors in the free layers 12. These magnetic vectors are, in turn, easily affected and may have their magnetic orientation changed by such external magnetic fields.

If an extra external magnetic field were present during a programming operation, this may cause undesired switching of non-selected magnetoresistive memory elements 10 because the combined magnetic field of the current flowing through one current line, with the external magnetic field, may by itself be large enough to switch the state of the non-selected memory element 10. Moreover, a programming operation may also result in not switching of the selected memory element 10s, as a result of the shift of the write window in an external magnetic field. As a simple example: if a small external field of only 10 Oe along the easy axis field components would be present, the 'zero-external magnetic field reference' (along the easy axis in this example) would be shifted with 10 Oe with respect to the origin. In a more general case, any in-plane external field results in a shift of the astroid curve from the origin, as its vectorial sum with the 2-D field vector. This means that magnetic fields which are generated by flowing a current through a current line, may now be large enough to undesirably switch a non-selected memory element 10, which would not be possible without the external magnetic field being present. Alternatively, if the external magnetic field has a different direction, magnetic fields may be too small to result in switching of the selected memory element 10s, which would not be possible without the external magnetic field being present.

A solution would be to shield the memory elements from any external field. However, also shielding has its limits so that, always, a higher magnetic field can be applied which will cause an external magnetic field in the vicinity of the data layer.

It is therefore an object of the present invention to provide a method and a device for preventing erroneous programming of a magnetoresistive memory element during presence of an external magnetic field.

The above objective is accomplished by a method and device according to the present invention.

The present invention provides an array of magnetoresistive memory elements comprising a magnetic field sensor unit for measuring an external magnetic field in the vicinity of the magnetoresistive memory elements, and means for temporarily disabling any programming operation when the measured external magnetic field exceeds a threshold value.

The magnetic field sensor unit may comprise one or more magnetic field sensors. The magnetic field sensor unit may be adapted to generate an output signal representative of the external magnetic field measured. The magnetic field sensor unit may be a digital or an analog sensor unit. The magnetic field sensor unit may be an element of the same construction as the magnetoresistive memory elements. However, the magnetic field sensor unit may be more sensitive to magnetic fields than the magnetoresistive memory elements.

The array according to the present invention may furthermore comprise driving circuitry for driving the memory elements of the array.

The array according to the present invention may furthermore also comprise a temperature measurement unit for measuring temperature in the vicinity of the magnetoresistive memory elements, wherein the means for temporarily disabling any programming operation are adapted to disable any programming operation when the measured temperature exceeds a pre-set temperature range.

According to a second aspect, the present invention provides an electronic device comprising an array of magnetoresistive memory elements according to the present invention.

According to a third aspect, the present invention provides a method for preventing erroneous programming of a magnetoresistive memory element during the presence of an external magnetic field. The method comprises
measuring the external magnetic field in the vicinity of the magnetic memory element, and temporarily disabling any programming operation if the measured external magnetic field exceeds a threshold value.

The method may furthermore comprise sensing temperature in the neighborhood of the magnetoresistive memory element and temporarily disabling any programming operation if the measured temperature exceeds a pre-set temperature range.

The above and other characteristics, features and advantages of the present invention will become apparent from the following detailed description, taken in conjunction with the accompanying drawings, which illustrate by way of example, the principles of the invention. This description is given for the sake of example only, without limiting the scope of the invention. The reference figures quoted below refer to the attached drawings.

FIG. 1A illustrates the MRAM programming principle and FIG. 1B illustrates the MRAM read principle.

FIG. 2 is a perspective view of a known 1T1MTJ MRAM design comprising a plurality of memory elements and perpendicular bit lines and word lines. Magnetic tunnel junctions (MTJ) are placed at the intersection regions of the bit lines and word lines. The bottom electrodes of the MTJs are connected to selection transistors with vias, which are used when reading the memory elements.

FIG. 3 illustrates an astroid curve showing criteria for robust programming operation in MRAM, resulting in stable write field windows.

Figure 4:
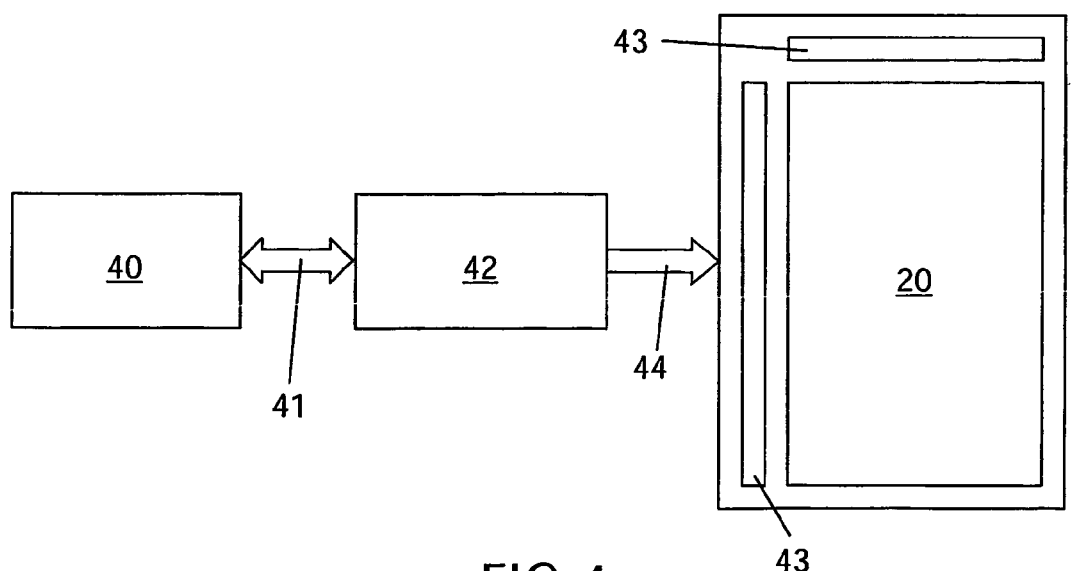

FIG. 4 diagrammatically illustrates a feedback system with a sensitive magnetic field sensor for programming operation enable/disable during MRAM programming operations, according to an embodiment of the present invention.

In the different figures, the same reference figures refer to the same or analogous elements.

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. Where the term "comprising" is used in the present description and claims, it does not exclude other elements or steps. Where an indefinite or definite article is used when referring to a singular noun e.g. "a" or "an", "the", this includes a plural of that noun unless something else is specifically stated.

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

The present invention provides a method and a device for preventing erroneous programming of a magnetoresistive memory element during presence of an external magnetic field.

According to the present invention, a magnetic field sensor 40 or sensor unit is provided with or is added to the MRAM array 20, and its output 41 is used for triggering means 42 for temporarily disabling any programming operation if the measured external magnetic field exceeds a threshold voltage.

According to an aspect of the present invention, a magnetic field sensor 40 is provided to measure a magnetic field in the neighborhood of the memory array 20. The magnetic field is preferably a magnetic field local, adjacent or near to the memory array 20. The magnetic field sensor 40 may be an analog sensor or a digital sensor. The magnetic field in the vicinity of the memory array 20 can be measured in various ways, either directly or indirectly.

The magnetic field sensor 40 can be any type of magnetic sensor which may be added to the circuit comprising magnetoresistive memory elements 10, e.g. to an MRAM IC. Preferably, the magnetic field sensor 40 is integrated into magnetoresistive memory array 20. The magnetic field sensor 40 can be, for example, a Hall sensor, which is a solid state semiconductor sensor which senses magnetic field strength and produces as output 41 a voltage that changes with this strength.

However, in case of the magnetoresistive memory array 20 comprising MRAM elements 10, it is advantageous to use as magnetic field sensor 40 a magnetic tunnel junction with the same stack composition as the MRAM elements 10 in the array 20. Further, the MRAM elements 10 themselves, or additional MRAM elements which are not used as memory elements could serve as magnetic field sensors 40 to monitor the local external disturbing field.

Because of the bistable magnetization configuration of MRAM elements as magnetic field sensors 40, they are not particularly sensitive to small fields. As soon as they are significantly influenced by a field to produce a sensible output signal, there is a risk that also MRAM elements containing data are already affected by the disturbing field. Therefore, it is desirable to use a magnetic field sensor 40 that is more sensitive to magnetic field strength than the MRAM elements 10 of the memory array 20 themselves. Preferably, the sensor 40 comprises the same material stack as used in the MRAM elements. The tuning of the sensor 40 so that it is more sensitive to magnetic fields can be achieved by e.g. using a different shape of the magnetic element. For example, a lower aspect ratio means that the device is more sensitive, or a larger size using a different orientation also means that it is more sensitive. In an embodiment of the present invention, one or more MRAM elements to be used as sensors are rotated over an angle, e.g. 90 degrees with respect to the normal MRAM elements 10 in the memory array 20, while the direction of the magnetization of the pinned layer 11, which is usually determined by exchange biasing, is the same. In this so-called crossed-anisotropy geometry the shape anisotropy causes that the direction of the free layer 12 will make an angle of 90 degrees with the direction of the pinned layer 11, which is the most sensitive point on the working curve of the magnetic tunnel junction.

Different methods of integrating the sensor with the MRAM chip are included within the scope of the present invention, and some examples are described hereinafter:

(1) A first approach is to integrate the sensor 40 on the MRAM chip—a monolithic integration. Hence, the sensor 40 will be very close to the memory array 20, and can possibly be included somehow in the memory array 20 itself. The sensor 40 can also be placed at a corner of the chip.

(2) A second approach is a hybrid method. The sensor 40 is no longer on the MRAM chip itself, or rather on a part of the substrate, for example silicon, on which the MRAM is located, e.g. embedded MRAM (e-MRAM) within a larger system, or SoC (system-on-chip). Due to high cost of implementing different functionality, in particular in the sensor area, there is a trend to 'horizontal' integration, or system-in-package, where different dies are combined into a single package. The proposal here is to combine two chips in one single package, i.e. a first chip comprising the MRAM array 20 and a second chip, on which the magnetic sensor(s) 40 is/are located.

(3) A further approach would be to simply use two different chips that are also separately packaged. One of the reasons for doing so could be the fact that a MRAM chip requires a high level of shielding, which is not required for the sensor 40. One or more extra pins on the MRAM chip are then needed to feed in the sensor signal.

It is to be noted that the magnetic field sensor(s) 40 or sensor unit(s) preferably provide a 2D representation of the magnetic field in the vicinity of the MRAM array 20. The distance between the magnetic field sensor(s) 40 and the array is preferably such that the field that is present in the MRAM array is measured. Since the far magnetic field will mostly be considered, length scales are moderate. Depending on the level of integration, as explained above, different distances may be used. In an on-chip implementation, the magnetic field sensor 40 is preferably as close as possible to the MRAM array, or when unshielded up to a distance of 1 cm therefrom. For a hybrid implementation in a single package, the distance will be in the order of 1 cm, and for different packages, it is preferred to place the sensor and the MRAM close together, e.g. next to one another, or the sensor on top of the MRAM chip.

In all of the above integration types, the magnetic field sensor output 41 is used as a direct signal representative of the local, external magnetic field. This magnetic field sensor output 41 is a signal which is sent to means for temporarily disabling a programming operation, such as programming operation enable/disable circuitry which, if the measured external field exceeds a threshold value, e.g. 5 Oe or more, temporarily disables any programming operation. For example, a disable/enable flag may be set when a certain threshold field exceeding known tolerances which may lead to erroneous programming operations.

For small fields, it may be decided not to apply the programming operation disabling, as the external fields falls within the write field margins. For present state-of-the-art MRAM, fields of a few Oe, e.g. 3 to 5 Oe, would not harm MRAM programming operations, hence for these fields the programming operations do not need to be disabled.

In an embodiment of the present invention, the magnetic field sensor output 41 is directly used as an input to a programming operation enable/disable circuitry which functions to generate a program enable/disable signal.

The programming operation enable/disable circuit 42 reads the output 41 (e.g. an analog signal—voltage or current) of the magnetic field sensor unit that may comprise one or more magnetic field sensors 40. As an example, two sensors, or sensor bridges, can be used to measure the two field components separately. The magnetic field sensor output(s) 41 are then translated or adapted by the programming operation enable/disable circuit 42 into required enable/disable control signals 44 which are fed to the drive circuitry 43.

In an embodiment of the present invention, analog output signal(s) 41 from the magnetic field sensor unit 40 measuring the two magnetic field components along easy and hard axis can be analyzed in terms of the effective two-dimensional magnetic field, and result in an enable/disable control signal 44 upon threshold detection in the circuit 42 for temporarily disabling the programming operation. As an example, threshold detection can be applied on the signal for both components separately, or alternatively, on the sum of both signals, so that in the two-dimensional plane of magnetic fields a specific area of fields around the zero magnetic field origin can be detected in circuit 42. The threshold detection can be set using a programmable voltage reference that may depend on the application, or the ultimate ambient in which the MRAM chip would be present. As a matter of fact, the threshold programming may be part of the initial test procedure of the MRAM chip. The enable/disable control signal 44 sets a flag that can be part of a built-in self-test (BIST), or a programming controller for the MRAM memory. Before a programming cycle of memory cells is started, a magnetic field measurement can be done and analyzed, so that the enable/disable control signal 44 can be created, or the enable/disable flag can be set. Depending on the flag, programming operations can be performed on the memory elements 10, or not.

When programming operations are disabled, rescue or error-signaling processes can be started, e.g. for storing incoming data in buffers or other (volatile) memory, which data would otherwise be lost or rate control signals may be sent, e.g. to stop the sending of source signals. As soon as programming operations are disabled, magnetic field measurements can be performed at regular time intervals, so that the enable/disable flag can be altered in the BIST or programming controller. As soon as the magnetic field sensor 40 does not sense the external field anymore, the disable/enable flag may be removed, thus allowing driving circuitry 43 of the memory array 20 to drive the memory array 20 for programming operations again. Data temporarily stored in buffers or other memory may be written to the MRAM memory elements 10, after which normal programming operation can be resumed.

In an alternative embodiment, magnetic field measurements can be performed at regular time intervals, at any time. In other words, magnetic field measurements are no longer activated only when a programming cycle is initiated, which would make the. MRAM control system more flexible.

In a further embodiment, the enable/disable control signal 44 can be set for a particular temperature range, or a combination of magnetic field and temperature, given the fact that a magnetic field sensor 40 may comprise a temperature compensation that may affect its output. The temperature signal that is available in this case can be used to set a flag for a particular temperature range for correct MRAM programming operation. As a result, the combined effect of temperature and magnetic field can be taken into account for preventing erroneous programming of a magnetoresistive memory element.

The disable/enable function has the advantage of being an economic solution for a wide variety of MRAM applications. The requirements on shielding for MRAM chips can be relaxed, if required at all.

It is to be understood that although preferred embodiments, specific constructions and configurations, as well as materials, have been discussed herein for devices according to the present invention, various changes or modifications in form and detail may be made without departing from the scope and spirit of this invention.

The invention claimed is:

1. An array of magnetoresistive memory elements comprising:
   a magnetic field sensor unit for measuring an external magnetic field in the vicinity of the magnetoresistive memory elements, the magnetic field sensor unit generating an output signal representative of the measured external magnetic field;
   disable circuitry responsive to the output signal to temporarily disable programming operation when the measured external magnetic field exceeds a threshold value; and
   a memory buffer to store incoming data while programming operations are temporarily disabled.

2. An array according to claim 1, wherein the magnetic field sensor unit comprises a plurality of magnetic field sensors.

3. An array according to claim 1, wherein the magnetic field sensor unit is an analog sensor unit.

4. An array according to claim 1, wherein the magnetic field sensor unit is an element of the same construction as the magnetoresistive memory elements.

5. An array according to claim 4, wherein the magnetic field sensor unit is more sensitive to magnetic fields than the magnetoresistive memory elements.

6. An array according to claim 1, furthermore comprising driving circuitry for driving the memory elements of the array.

7. An array according to claim 1, furthermore comprising a temperature measurement unit for measuring temperature in the vicinity of the magnetoresistive memory elements, wherein the disable circuitry is adapted to disable any programming operation when the measured temperature exceeds a pre-set temperature range.

8. An electronic device comprising:
   an array of magnetoresistive memory elements:
   a magnetic field sensor unit for measuring an external magnetic field in the vicinity of the magnetoresistive memory elements, the magnetic field sensor unit generating an output signal representative of the measured external magnetic field;
   disable circuitry responsive to the output signal to temporarily disable programming operation when the measured external magnetic field exceeds a threshold value; and
   a memory buffer to store incoming data while programming operations are temporarily disabled.

9. Method for preventing erroneous programming of a magnetoresistive memory element during the presence of an external magnetic field, the method comprising:
   measuring the external magnetic field in the vicinity of the magnetic memory element;
   temporarily disabling any programming operation if the measured external magnetic field exceeds a threshold value; and
   storing incoming data in a memory buffer while programming operations are temporarily disabled.

10. Method according to claim 9, furthermore comprising sensing temperature in the neighborhood of the magnetoresistive memory clement and temporarily disabling any programming operation if the measured temperature exceeds a pre-set temperature range.

11. An array according to claim 1, wherein the magnetoresistive memory elements have a magnetic tunneling junction structure, and wherein the magnetic field sensor unit is a rotated one of the magnetoresistive memory elements.

* * * * *